ELECTROMECHANICAL MEANS USING A SEMICONDUCTOR

Original Filed March 17, 1965 3 Sheets-Sheet 1

INVENTORS
JAMES B. PUTTERBAUGH
JOSEPH E. WISER
BY
ATTORNEY

INVENTORS
JAMES B. PUTTERBAUGH
JOSEPH E. WISER
BY
Robert Lennis
ATTORNEY

ELECTROMECHANICAL MEANS USING A SEMICONDUCTOR

Original Filed March 17, 1965 3 Sheets-Sheet 3

INVENTORS
JAMES B. PUTTERBAUGH
JOSEPH E. WISER
BY
ATTORNEY

United States Patent Office 3,466,464
Patented Sept. 9, 1969

3,466,464
ELECTROMECHANICAL MEANS USING A SEMICONDUCTOR

James B. Putterbaugh and Joseph E. Wiser, Indianapolis, Ind., assignors to P. R. Mallory & Co., Inc., Indianapolis, Ind., a corporation of Delaware
Original application Mar. 17, 1965, Ser. No. 440,567, now Patent No. 3,294,930, dated Dec. 27, 1966. Divided and this application Aug. 18, 1966, Ser. No. 590,117
Int. Cl. H03k *17/28*
U.S. Cl. 307—246 1 Claim

ABSTRACT OF THE DISCLOSURE

A transistor is included as part of an electrical circuit which is responsive to switches that are controlled by cam means of an electrical mechanical device. The transistor energizes an electrode such as a solenoid.

This application is a division of application Ser. No. 440,567, now U.S. 3,294,930.

The present invention relates to a novel pulse timer for sequentially providing a pulse of predetermined time duration to an electrical device that requires electrical energization before the device is operational.

Pulse timers are known and have found utility in the control of the sequence of operations experienced by electrical devices such as solenoids and the like which require a pulse of short time duration to be operational.

A present need exists for a pulse timer of increased flexibility due to the various environmental situations in which the timer is to be utilized. The various environmental situations would include those wherein a source of alternating current is not available. However, the pulse timer must be retained as a physically small and compact unit in order to be flexible with regard to physical location.

If the pulse timer must occupy a physical area no larger than prior art pulse timers yet be adaptable to various environmental conditions and still retain its accuracy, design problems of magnitude are encountered. One of the design problems being that the timer must be self-contained yet provide a pulse of predetermined time duration at the desired time interval. In addition the timer must be capable of faithfully and accurately repeating a sequence of operations as desired. In several of the prior art devices, a plurality of cam actuated follower switches are cooperatively associated with the timer. Stacks of camming means are coaxially coupled to a cam shaft so as to tangentially engage a follower arm of the follower switch. The follower arm is actuated from either an engaged position to a disengaged position or from a disengaged position to an engaged position depending on the angular position of the cam associated with a particular follower switch. The contours of the periphery of the cam determine the state of actuation of the prior art pulse timer. It is seen that such a pulse timer, although satisfactory for its intended purpose is, nevertheless, complicated and cumbersome and includes a great many associated mechanical parts. In addition such a pulse timer requires an ancillary source of alternating current. A synchronous motor is generally utilized to provide the actuation force for driving the cams. It is seen that the use of cam actuated switches necessitates the use of a means capable of generating a relatively high driving torque and the use of source of alternating current. The alternating current prime mover means generating the high driving torque is bulky and the need for an alternating current source seriously effects the flexibility of the several prior pulse timers. The several prior art devices necessitate the use of structure having a relatively large volumetric displacement.

Therefore, it is an object of the present invention to provide a pulse timer that furnishes a plurality of spaced, short pulses at predetermined time intervals.

Another object of the present invention is to provide a pulse timer having a pulse duration of about 50 milliseconds at selected time intervals of unequal time duration.

Yet another object of the present invention is to provide a novel pulse timer that requires a relatively small torque to initiate the operation thereof.

Still another object of the present invention is to provide a flexible, simple, efficient, effective, and accurate pulse timer means.

Another object of the present invention is to provide a pulse timer that is relatively small thereby occupying a minimum amount of space in the housing of the device with which the pulse timer is utilized.

Yet still another object of the present invention is to provide a pulse timer having optimum reliability characteristics afforded by compact construction having a minimum number of parts.

A further object of the present invention is to provide a pulse timer usable in shallow depth locations.

The present invention in another of its aspects relates to the novel features of the instrumentalities of the invention described herein for teaching the principal object of the invention and to the novel principles employed in the instrumentalities whether or not these features and principles may be used in the said object and/or in the said field.

With the aforementioned objects enumerated other objects will be apparent to those persons possessing ordinary skill in the art. Other objects wil appear in the following description, appended claim and appended drawings. The invention resides in the novel construction, combination, arrangement, and cooperation of elements as hereinafter described and more particularly as defined in the appended claim.

The appended drawings illustrate the preferred embodiment of the present invention constructed to function in the most advantageous modes devised for the practical application of the basic principles involved in the hereinafter described invention.

Figure 1:
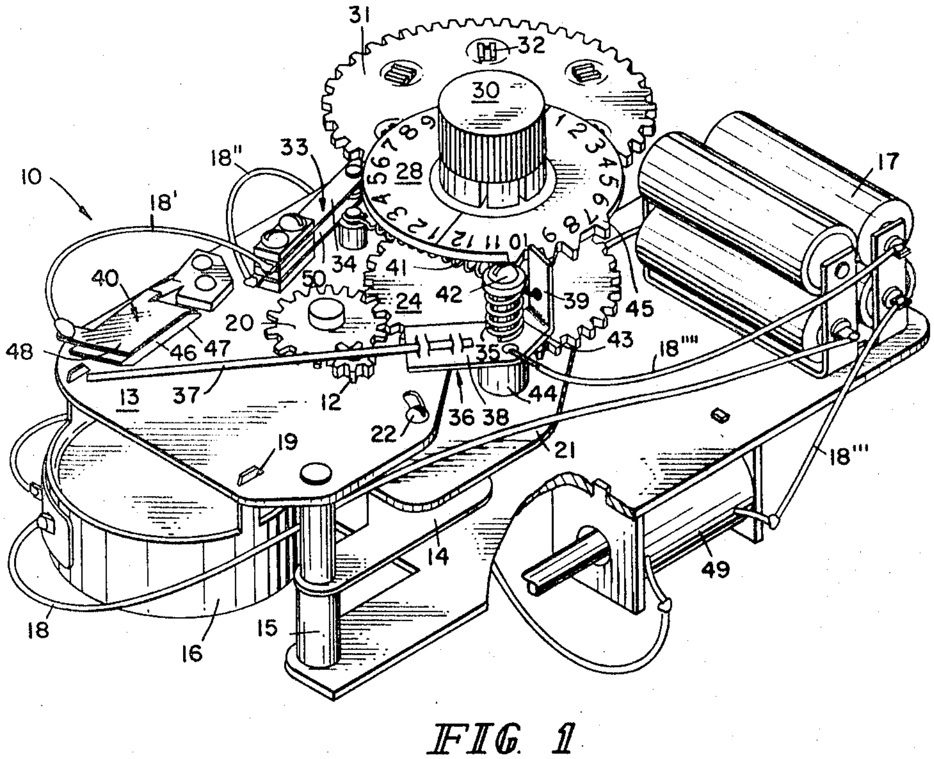
FIGURE 1 is a perspective view of the novel pulse timer.

Generally speaking, the means and method of the present invention relate to an accurate, simple, efficient, and flexible electromechanical pulse timer means. The electromechanical means includes a drive means. A cam means having rise and fall contours is rotatably driven by the drive means. An arcuately displaceable, spring biased means rides on the contours of the cam means. A deflection means having an electrically conductive upper surface and an electrically non-conductive lower surface is placed in an interference path with the spring biased means. The spring biased means is arcuately displaced in a first direction so as to slidably engage the lower, electrically non-conductive surface of the deflection means as the spring biased means rides up the rise contour of the cam means. The spring biased means is displaced in the opposite or second direction to thereby slidably engage the electrically conductive upper surface of the deflection means. A means is coupled to the spring biased means for regulating the speed of arcuate displacement of the spring biased means in the second direction. A means including a plurality of node means is rotatably driven by the cam means. A normally open switch means located in an interference path with said node means is closed by engagement with the node means thereby closing an electrically conductive circuit between the spring biased means and the switch means as the spring biased means slidably engages the upper surface of the deflection means.

More particularly, the present invention relates to a pulse timer that provides an electrical pulse of about 50 milliseconds in time duration in accordance with a predetermined time sequence. A mounting frame is part of the pulse timer and is utilized to mount various other parts of the timer in cooperative relationship each with the other. A prime mover means such as a direct current motor is fixedly coupled to the mounting means. The prime mover means includes an output shaft means rotating at a constant speed. A mechanical clock means is coupled to and driven by the shaft of the prime mover means. The clock means translates the movement of the shaft to a predetermined, timed rotational output. A clutch means is coupled to and rotatably driven by the timed output of the clock means. The clutch means includes a cam means having rise and fall contours. A spring biased flipper means including a follower means and an arm means is pivotably coupled to the mounting frame. The arm means rides on and follows the contours of the cam means. The arm means is arcuately displaced in accordance with the contours of the cam means. A deflection means includes an inclined means having an electrically conductive upper surface and an electrically non-conductive lower surface. The deflection means is placed in an interference path with the arm means of the flipper means such that the arm means slidably engages the lower surface of the deflection means as the arm means is displaced in a first direction in response to the follower means riding up the rise contour of the cam means. The arm means slidably engages the upper surface of said deflection means as said arm means is displaced in a second direction in response to the follower means falling along the fall contour of the cam means. A means is coupled to the flipper means for regulating the speed of arcuate displacement of the arm means in the second direction. A large gear means is connected to and rotatably driven by the clutch means. The large gear means includes a plurality of radially spaced U-shaped means. A follower switch means including a contact carrying follower means and a contact carrying blade means has the follower means located in an interference path with the U-shaped means. One of the U-shaped means periodically engages the follower means thereby displacing the follower means into engagement with the contact carrying blade so as to close an electrically conductive circuit between the flipper means and the follower switch means through the upper surface of the deflection means as the flipper means slidably engages the upper surface of the deflection means.

A second embodiment of the present invention pertains to an electromechanical means using a semiconductor. The electromechanical means includes a drive means and a cam means having rise and fall contours, the cam means driven by the drive means. A first normally open follower switch means has means riding on the contours of the cam means. The fall contours cooperate with the switch means to thereby close the follower switch and the rise contours cooperate with the switch means to open the switch. A means including a plurality of node means is rotatably driven by the cam means. A second normally open follower switch means is placed in an interference path with the node means so that engagement with the node means closes the normally open second switch. A source of electrical energy is coupled in series with the second switch. A resistance means and a capacitance means is connected across the series coupled source as said second switch closes thereby charging the capacitor. A semiconductor means, a transistor, includes a base, a collector and an emitter. The base of the transistor is connected in series to the first switch and the base of said transistor is coupled between the capacitor and the resistor as the first switch closes. The emitter is connected to ground. The collector is connected to one side of a load means, the solenoid. The other side of the load means is coupled to the second switch. The closing of the second switch causes the capacitor to bias the transistor to conduction by discharging current therethrough. The current flow from the source through the transistor actuates the load.

Referring now to the drawings, which illustrate the preferred embodiments of the present invention, it is seen that the pulse timer means is generally indicated by numeral 10. The essential components of the aforementioned pulse timer means includes a mechanical clock means 11 which is mechanically connected to pinion 12 by any suitable means such as a gear train. Pinion 12 is displaced in the counterclockwise direction with a constant rotary motion. The clock means is secured between main mounting frame 13 and mounting means 14. A plurality of post means 15 retain the main mounting frame and the mounting means in spaced parallel relationship. Since the mechanical clock means may be of any suitable form, of which there are many suitable conventional types, a detailed illustration has been omitted from the drawings in the interest of a clearer showing of the inventive portion of the pulse timer.

It is seen that a prime mover means such as direct current motor 16, is mechanically coupled to clock mechanism 11 to drive the clock mechanism at a constant, predetermined rate of speed. A suitable direct current source such as a plurality of "dry cell" batteries 17 or the like are electrically connected to the direct current motor 16 by any suitable electrically conductive conduit means such as electrically conductive means 18. The direct current motor is mounted to main mounting frame 13 by any suitable means such as a plurality of tabs 19.

The main mounting frame predeterminately locates pinion 12 with respect to speed reduction gear 20 such that pinion meshes with and drives the speed reduction gear at a constant, predetermined rate of speed in the clockwise direction.

Fixedly coupled to mounting frame 13 is support means 21. The support means is fixedly coupled to the mounting frame by a plurality of securing means such as a plurality of rivets 22 or the like. Fixedly staked to the support means is hub means 23. Rotatably carried by the hub means is gear means 24 of clutch means 25. The gear means includes a hollow shaft 26 fixedly staked thereto by any suitable means such as by welding, soldering or the like. Axially abutting hollow shaft 26 and carried by hub 23 is pinion 27. Pinion 27 is fixedly coupled to cam means 28 by any suitable means such as force fitting, interference fitting or the like. It is seen that the arcuate displacement of the pinion is directly proportional to the arcuate displacement of the cam means. The cam means may have on one side thereof coded indicia indicative of a particular time interval such as hours of the day or the like. Mechanically coupling pinion 27 to gear 26 is clutch spring means 29. The coils of the spring tighten about both the hollow shaft of the gear and the shaft of the pinion 27 as the gear means is driven in the counterclockwise direction to thereby transfer the rotational displacement of the gear means to the pinion 27. It is seen that if the pinion is manually rotated in the counterclockwise direction by means of manually rotating the cam means in the counterclockwise direction that the coils of the clutch spring become loose about the pinion and the hollow shaft of the gear means thereby allowing the pinion and the cam to rotate independently of the main gear. A knob 30 is press fitted to the surface of the cam means having printed indicia thereon in order to facilitate manual arcuate displacement of the cam means. The printed indicia assist in locating the cam means at the desired location.

Pinion 27 meshes with and rotatably drives large gear 31. Large gear 31 carries thereon a plurality of radially spaced U-shaped means or node means 32. The U-shaped means are equally spaced, each from the other. It is seen that the axis of each individual U-shaped means is parallel to the axis of the large gear.

Fixedly coupled to main mounting frame 13 is follower switch means 33 including a follower arm 34 which rides in an interference path with the plurality of U-shaped means 32 so that the lower extremity of the U-shaped means engages with and thereby biases the contacts of the follower switch means into engagement at predetermined time intervals as determined by the placement of the U-shaped means on the large gear.

A flipper means 36 including an arm means 37, an L-shaped follower means 38, and an adjustable post means is cooperatively associated with deflection means 40 so as to provide a direct current pulse for predetermined durations of time at selected time intervals. As illustrated in FIGURE 1, the stem portion 39 of the follower means 38 is spring biased by spring 41 so as to ride on the periphery of cam means 28. It is seen that the stem portion of the follower means will follow the peripheral rise and fall contours of the cam means, as the cam means is rotationally displaced.

The adjustable post means 35 includes adjusting screw means 42, friction coil spring means 43, and plastic hollow cylindrical means 44. It is seen that follower means 38 is pivotably retained between the friction coil spring and the plastic hollow cylindrical means 44. As the adjusting screw means is tightened into its threaded aperture (not shown) in support means 21, the friction coil spring is compressed thereby exerting an additional downward force on the pivotable follower means 38. It is seen that the rate of arcuate displacement of the follower means about the axis determined by the adjustable post means is considerably slowed by the resulting increased coefficient of friction. The rate of speed of the arcuate displacement of the follower means can be effectively regulated by adjusting the aforementioned means.

The four cam lobes 45 of cam means 28 serve to bias the flipper means 36 in the clockwise direction whereas the spring bias means 41 serves to bias the flipper means in the counterclockwise direction to ride against the periphery of the cam means. It is seen that a clockwise displacement of the flipper means causes displacement of the coils of the spring means 41 thereby storing energy in the spring means. Upon disengagement of the flipper means and a particular cam lobe, the spring means releases its stored energy and returns the flipper means to its initial position with respect to the cam means.

Figure 2:
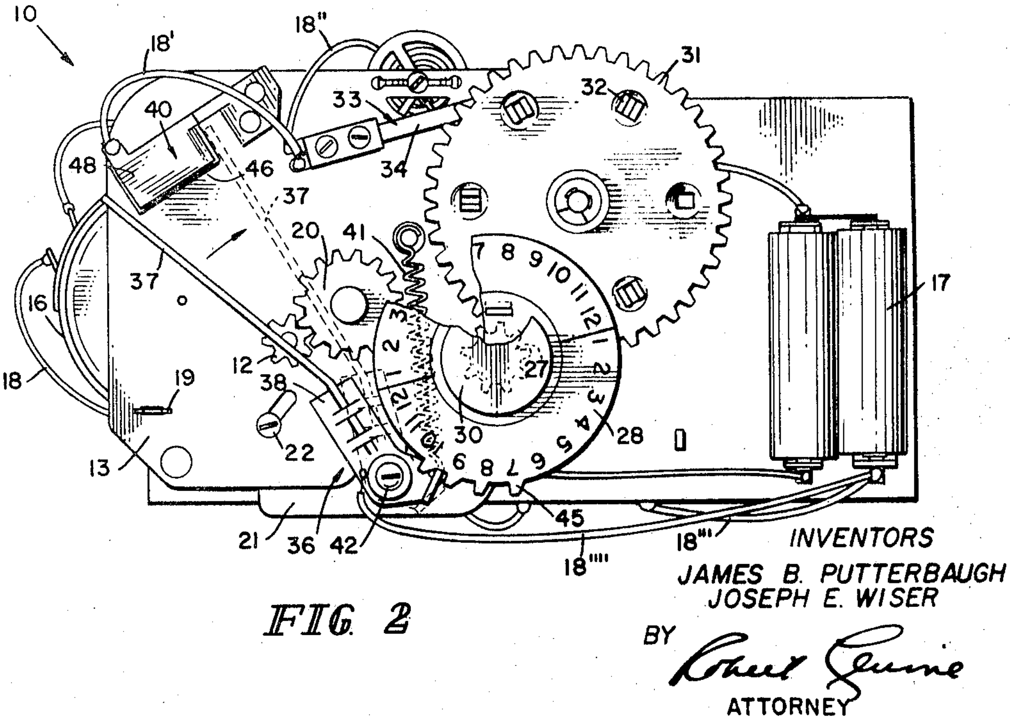
FIGURE 2 is a top view of the pulse timer with particular components partially cut-away to illustrate the location of the components of the pulse timer.
Figure 3:
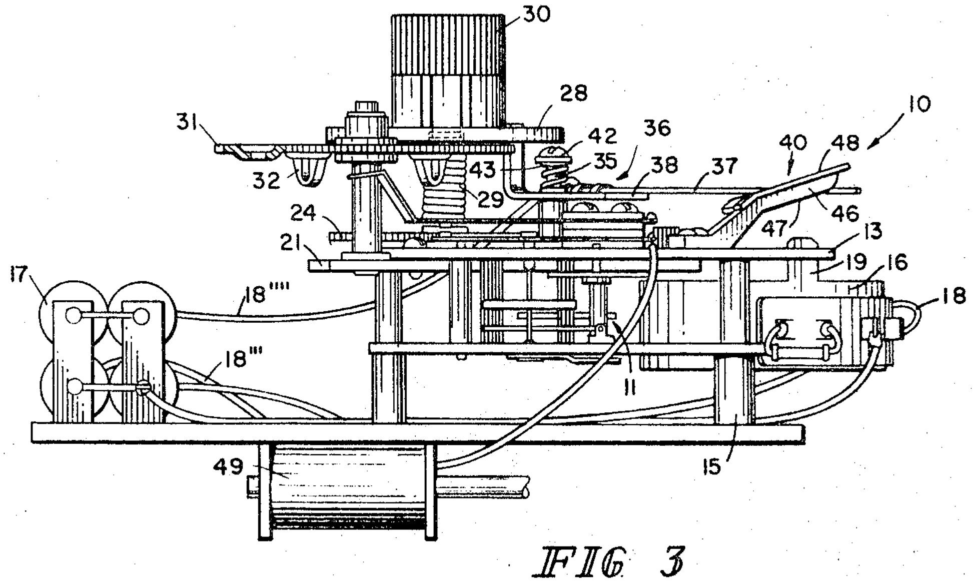
FIGURE 3 is a side view of the pulse timer showing the location of various components of the pulse timer.
Figure 4:
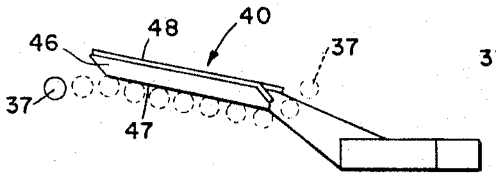
FIGURE 4 illustrates a flipper deflection means and a plurality of dotted line cross-sectional views of a flipper means showing the initial path of deflection of the flipper means as the flipper means engages the flipper deflection means.
Figure 5:
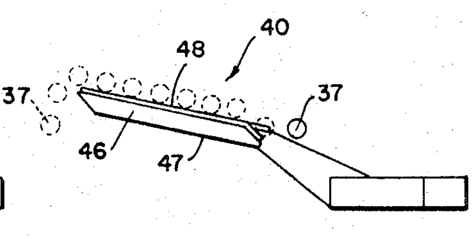
FIGURE 5 shows the flipper deflection means and a plurality of dotted line cross-sectional views of the flipper means illustrating the return path of the flipper means as it engages the flipper deflection means.

As illustrated in FIGURES 1 and 2, the deflection means 40 is fixedly coupled to the main mounting frame 13 by any suitable means such as by welding, soldering, riveting or the like. FIGURES 4 and 5 show that the deflection means has deflection arm 46 that is fabricated so as to be at a predetermined angle with respect to the main mounting frame. The deflection arm has a lower surface 47 fabricated from an electrically nonconductive surface such as plastic or the like. The upper surface 48 has a strip of electrically conductive metal mounted thereon of predetermined length and width. The electrically conductive upper surface of the deflection means is electrically coupled to switch means 33 by electrically conductive wire 18'. An electrically conductive wire 18'' couples the second side of follower switch 33 to a solenoid means 49. The solenoid means is utilized to mechanically actuate a plurality of devices such as a switch, a lever or the like. The other side of the solenoid is electrically connected to the plurality of battery means 17 by electrically conductive wire 18'''. The other side of the battery means 17 is electrically coupled to the flipper means 36 by electrically conductive wire 18''''.

Having described the structure of the present invention as illustrated in FIGURES 1–8, the cooperation between the described structural elements will be disclosed. The novel device of the present invention is utilized to provide a plurality of pulses over a timed sequence to thereby operate or actuate an electrically associated means such as solenoid means 49 or the like. The pulse device would have a multiplicity of uses of which would be its use as a timer to regulate the cycle of a water softener means or the like. The time interval between the individual pulses would be regulated by the radial location of the cam lobes 45 and the rate of speed at which cam means 28 is rotating. The length of time arm means 37 is in contact with conductive upper surface 48 determines the time duration of the pulse. The friction coil spring means 43 of adjustable post means 35 is set so as to fix the time interval which is required for arm 37 to sweep thereacross at about 50 milliseconds.

Pinion 12 is mechanically coupled to and rotatably driven at a constant rate of speed by mechanical clock means 11. As disclosed hereinbefore, the mechanical clock means is driven by direct current motor means 16 which translates the electrical energy of the batteries 17 to a continuous rotary motion output. Pinion 12 meshes with and rotatably drives speed reduction gear 20 at a determined rate of speed. Speed reduction gear 20 meshes with and rotatably drives gear means 24 of clutch means 25 in the counterclockwise direction. The gear means 24 rotates at one revolution per day, however, it is understood that the gear means may rotate with any desirable rotational speed by merely altering the speed of the clock means or the ratios between the various gears or both. The rotational movement of the gear means 25 is transmitted to cam means 28 by means of clutch spring means 29 of the clutch means. It is seen that cam 28 rotates in the counterclockwise direction at the rate of one revolution per day since it is coupled to gear means 24. The pinion 27 of the clutch means also rotates at one revolution per day.

As the cam rotates in the counterclockwise direction, the first of the plurality of cam lobes 45 engages tab portion 39 of the follower means 28. It is seen that the tab portion rides up the rise contour of the cam lobe thereby pivoting the follower means in the clockwise direction about adjustable post means 35. As disclosed hereinbefore, the arm means 37 is fixedly coupled to the follower means and, a result thereof, will be displaced through a predetermined arc in the clockwise direction. After traversing a portion of the predetermined arcuate displacement, the arm of the flipper means engages the lower surface 47 of the deflection means 40. The path of deflection of the arm in the clockwise direction is illustrated by the dotted lines of FIGURE 4. It is seen that as the arm is displaced horizontally by the rise contour of the respective cam lobe, the arm is also deflected in the vertical direction by the slope of the lower surface of the deflection means, thereby storing energy. The deflection of the arm in the vertical direction continues until the arm is arcuately displaced in the clockwise direction a sufficient distance so that the arm is no longer engaged with the deflection means. As shown in FIGURE 4, the arm is displaced in the vertical direction to its original plane by the release of the energy stored in the arm. When the arm is displaced to its original vertical position, tab 39 has ascended to the apex or dwell point of cam lobe 45. Continued rotational displacement of the cam causes the tab and the cam lobe to disengage due to the fall contour of the periphery of the cam. The disengagement of the tab and the cam lobe causes the tab to be arcuately displaced in the counterclockwise direction to its original position. The amount of arcuate displacement is determined by the peripheral contour of the cam means 28. As disclosed hereinbefore, arm means 37 is fixedly coupled to follower means 34 as is tab 39, therefore, as tab 39 is arcuately displaced in the counterclockwise direction, arm means 37 is likewise displaced in the counterclockwise direction. FIGURE 5 illustrates the path followed by the arm means as it engages the inclined surface, the conductive upper surface 46 of the deflection means. The arm engages with and rides up the conductive surface thereby storing energy as the arm is displaced towards its initial horizontal starting position. The incline of the conductive surface insures that the arm will remain engaged with the conductive surface rather than bounce thereacross as the arm returns to its initial position. It is appreciated that the bouncing of the arm across the conductive surface would cause an intermittent electrical contact. Upon disengagement of the arm with the conductive surface, the arm is vertically displaced to its initial vertical position by the release of the energy stored therein when the arm rode up the incline. Thereafter the arm continues its displacement in the counterclockwise direction until the arm attains its initial position as illustrated by FIGURES 1 and 2.

Pinion 27, coupled to cam 28, rotates in the counterclockwise direction at the rate of one revolution per day. Meshing with and rotatably driven by pinion 27 is large gear 31. Due to the ratio that exists between large gear 31 and pinion 27, the large gear rotates once every six days, that is, the large gear rotates one complete revolution for each six revolutions of pinion 27. Circumferentially spaced about the large gear is a plurality of U-shaped means 32. It is seen that the axis of each U-shaped means is parallel to the axis of the large gear. Six equally spaced U-shaped means are illustrated in FIGURE 2, however, it will be understood that the spacing between the respective ones of the U-shaped means and the number of U-shaped means utilized would vary in accordance with the programmed sequence of actuations desired.

Figure 6:
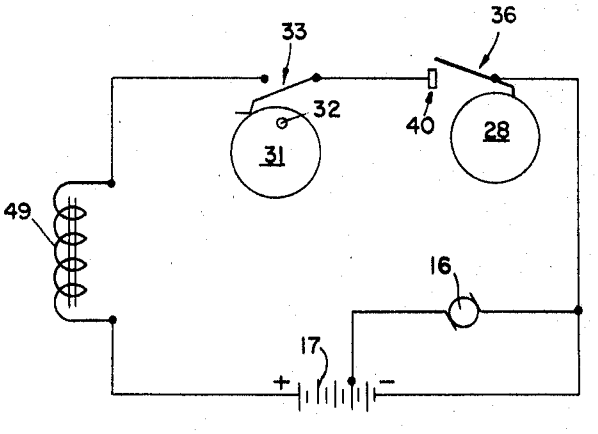
FIGURE 6 is an electromechanical schematic of the pulse timer of the present invention.

A follower switch means 33 is fixedly coupled to the main mounting frame 13 as described hereinbefore. A resilient follower arm 34 of the follower switch means is positioned so as to be in an interference path with the U-shaped means. When a U-shaped means engages with the follower arm, the follower arm is displaced so as to engage the contact of contact carrying blade 50 of the follower switch means. It is seen that an electrical current, if any is present, is permitted to flow through the follower switch means during the engaged condition of the blade and the follower arm. Continued rotational displacement of the large gear causes the U-shaped means to disengage the resilient follower, thereby allowing the resilient follower arm to return to its initial position thus disengaging the contact of the contact carrying blade and terminating the flow of electrical current through the follower switch, if any. The follower switch has an electrically conductive means 18′ that electrically connects the follower arm of the switch to conductive upper surface 48 and an electrically conductive means 18″ that electrically connects the contact carrying blade of the switch to one side of the solenoid means. As disclosed hereinbefore, the other side of the solenoid means is electrically connected to battery means 17. It is seen that if the arm means 37 of the flipper means is engaged with the conductive surface 48 of the deflection means and if the U-shaped means is positioned so as to cause engagement of the follower arm with the contact carrying blade, an electrical circuit may be traced from the batteries through the flipper means, through the deflection means, through the follower switch, through the solenoid and to the other side of the battery means. Under the aforementioned condition, the solenoid is actuated by the flow of current therethrough. If either or both of the following conditions exist, no electrical current will flow to the solenoid. The conditions are: if the arm means 37 is not engaging the conductive upper surface of the deflection means or if the U-shaped means is not biasing the follower arm of the switch into engagement with contact carrying blade. FIGURE 6 of the drawings clearly illustrates the foregoing. FIGURE 6 shows both the follower switch and the flipper means in the disengaged or normally open position.

It is seen that as cam means 28 is rotationally displaced, cam lobe 45 contacts and arcuately displaces the flipper means. The flipper means is displaced slowly in a clockwise direction thereby displacing spring means 41 so as to store energy therein. As the flipper means is displaced in the clockwise direction, the arm of the flipper means passes under the deflection means. When the cam lobe disengages the flipper means, the flipper means is displaced rapidly in the counterclockwise direction by the release of the energy stored in the spring means. Counterclockwise displacement of the flipper means causes the arm means 37 to ride up the inclined plane of the deflection means thereby engaging with the conductive upper surface 48. If a U-shaped means is located so as to bias the contacts of the switch into engagement, electrical current flows to the solenoid for a period of about 50 milliseconds.

By rotating adjusting the adjusting screw means to exert a greater frictional pressure against the flipper means, the speed of the rotation of the flipper in the counterclockwise direction may be effectively regulated so as to lengthen the time that the flipper means engages the conductive upper surface of the deflection means.

By utilizing the clutch means 25, an operator may rotate the cam having printed indicia thereon through the knob and also rotate the large gear in sequence. The aforementioned allows the operator to set the pulse timer so that the pulses occur at the desired time of a day.

Figures 7, 8, 9:
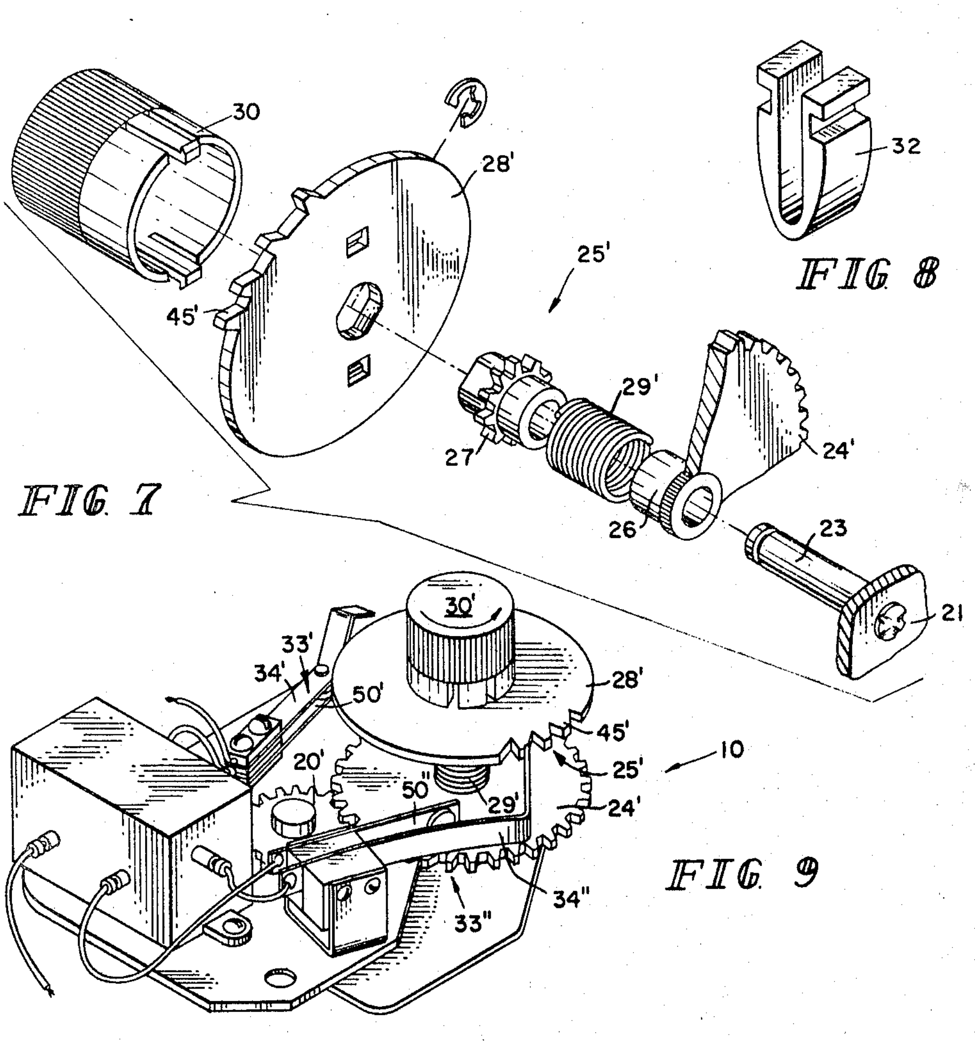
FIGURE 7 illustrates a combination clutch means and cam means of the present invention.
FIGURE 8 shows a U-shaped means for deflecting a follower arm of a follower switch.
FIGURE 9 is an embodiment of the present invention illustrating features not found elsewhere.
Figure 10:
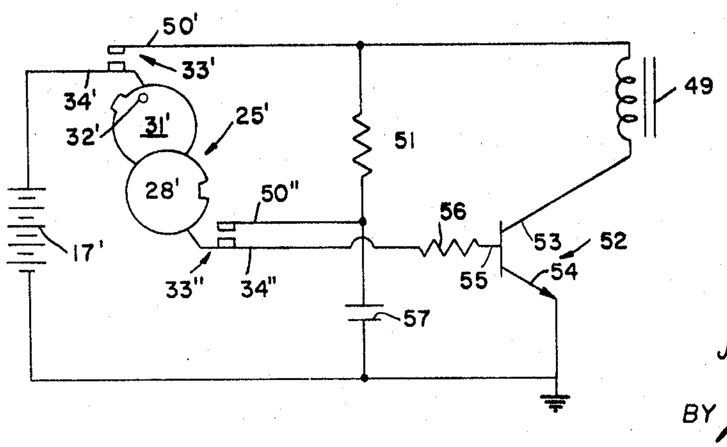
FIGURE 10 is an electromechanical schematic of the pulse timer of FIGURE 9.

FIGURES 9 and 10 illustrate an embodiment of the present invention utilizing features not shown or illustrated elsewhere.

FIGURES 9 and 10 show a pulse timer 10′ utilizing a direct current motor (not shown) cooperatively associated with a mechanical clock means (not shown). The clock means is utilized to drive a clutch means 25′ at a predetermined rate of speed. The direct current motor and the mechanical clock means are cooperatively associated as described and illustrated in FIGURES 1–3. A pinion (not shown) meshes with and rotatably drives speed reduction gear 20′ in the clockwise direction in substantially the same manner as pinion 12 drives speed reduction gear 20 of FIGURES 1–3. The clutch means includes a gear means 24′ that meshes with and is rotatably driven by the speed reduction gear 20′ in the counterclockwise direction, a clutch spring means 29′ and a cam means 28′. The clutch spring means 29′ couples gear means 24′ to cam means 28′ such that counterclockwise rotation of the gear means is transferred to the cam means so as to drive the cam means in the counterclockwise direction. Manual counterclockwise rotation of the cam means through the knob 30′ displaces th cam means in the counterclockwise direction without displacing the gear means. It is seen that the coils of the clutch spring means loosen to a sufficient degree about the gear means 24′ to allow the manual rotation of the cam means in the counterclockwise direction.

The clutch means meshes with and rotatably drives a large gear (not shown) that has a plurality of radially spaced U-shaped means or node means (not shown). It is seen that the nodes or U-shaped means are coupled to the large gear substantially in the same manner as nodes or U-shaped means 32 are coupled to large gear 31.

Cam means 28′ includes a plurality of rise and fall contours cut into the periphery thereof. Riding on the periphery of the cam means is follower arm 34″ of follower switch means 33″. Carried in substantially spaced parallel relationship with the follower arm 34″ is contact carrying blade 50″. It is seen that as the follower arm rides on rise contour of the cam, the follower switch is biased to an open or electrically non-conductive position. As the follower arm falls along the fall contour of the cam means' periphery, the contact of the follower arm engages with the contact of the contact carrying blade thereby biasing the switch to the closed or electrically conductive position. It is seen that the rise and fall contours may be positioned as desired on the periphery of the cam in accordance with the desired sequence of operations.

A second follower switch means 33′ is positioned so as to be in an interference path with the nodes on U-shaped means carried by the large gear 28′. The follower switch means 33′ includes a follower arm means 34′ and a contact carrying blade 50′. The contact carrying blade 50′ is positioned so as to be in substantially spaced parallel relationship with the follower arm 34′ in a normally open position. As the nodes engage the follower arm 34′, the follower arm is biased so as to engage the contact carrying blade means thereby allowing the switch to be electrically conductive.

FIGURE 10 shows that the follower arm 34′ is electrically connected to the positive side of direct current source 17′. The contact carrying blade 50′ is electrically coupled to one end of the parallel circuit including resistance 51 and solenoid 49′. The other end of the solenoid is electrically connected to the collector 53 of NPN transistor 52. The emitter 54 of the transistor is electrically connected to the negative side of direct current means 17′. The base 55 of the transistor is electrically connected to one side of bias resistor 56. The other side of the bias resistor is electrically connected to follower arm 34″ of follower switch 33″. The contact carrying blade 50″ is electrically coupled between the other side of resistor 51 and the first side of capacitor 57. The other side of capacitor 57 is electrically coupled to the negative side of direct current source 17.

The circuit functions as follows: Assuming that the circuit is quiescent, the capacitor 57 is initially in an uncharged condition. The second switch closes thereby charging the capacitor. The charging current continues until the capacitor is charged to a voltage exceeding the potential at which the transistor conducts. The length of time required to charge the capacitor to said voltage is dependent on the value of resistance 51 and the value of capacitance of capacitor 57. The semiconducting circuit is turned on by the closing of switch 33″. The voltage stored by capacitor 57 is sufficient magnitude to cause firing or breakdown of the transistor 52. The capacitor is discharged through a path including the resistance 56 and the transistor. It is seen that the solenoid is actuated by the flow of current from the battery through the transistor to ground. The discharge of the capacitor through the transistor is of sufficiently short time to last but a few milliseconds before the voltage stored by the capacitor drops so that the transistor is biased to cutoff thereby preventing addition current flow therethrough. The solenoid is deenergized as a result thereof. Switch 33″ is thereafter biased open. The firing program of the transistor may be varied by varying the sequence of operations of the switches as disclosed hereinbefore.

While the invention is illustrated and described in its preferred embodiments, it will be understood that modifications and variations may be effected without departing from the scope of the novel concepts of the invention as set forth in the appended claim.

Having thus described our invention, we claim:

1. An electromechanical means for providing an electrical pulse comprising: a drive means; a cam means having rise and fall contours, said cam means driven by said drive means; a first normally open follower switch including means riding on the contours of said cam means, said fall contours closing said follower switch, said rise contours opening said switch; means including a plurality of node means rotatably driven by said cam means; a second normally open follower switch in an interference path with said node means, engagement with said node means closing said normally open swtich; a battery source coupled in series with said second switch; a resistance means and a capacitance means connected across said series coupled second switch and said battery as said second switch closes thereby charging said capacitor; and a transistor including a base, a collector and an emitter, said base connected in series to said first switch, said base of said transistor coupled between said capacitor and said resistor as said first switch switch closes, said emitter connected to ground, said collector connected to one side of a load means, another side of said load means coupled to said second switch, closing of said second switch causing said capacitor to bias said transistor to conduction by discharging current therethrough, said current flow from said source actuating said load.

References Cited

UNITED STATES PATENTS

| | | | |
|---|---|---|---|
| 2,906,926 | 9/1959 | Bauer | 317—148.5 |
| 3,017,543 | 1/1962 | Hillman et al. | 317—148.5 |
| 3,098,953 | 7/1963 | Herr | 317—148.5 |
| 3,131,318 | 4/1964 | Snyder et al. | 307—293 XR |

JOHN S. HEYMAN, Primary Examiner

STANLEY D. MILLER, Assistant Examiner

U.S. Cl. X.R.

200—38; 307—141, 260, 293; 317—142, 148.5, 151